(12) United States Patent
Nishida et al.

(10) Patent No.: US 6,586,807 B2
(45) Date of Patent: Jul. 1, 2003

(54) SEMICONDUCTOR INTEGRATED CIRCUIT DEVICE

(75) Inventors: Akio Nishida, Tachikawa (JP);
Noriyuki Yabuoshi, Hitachinaka (JP);
Yasuko Yoshida, Sayama (JP);
Kazuhiro Komori, Musashimurayama (JP); Sousuke Tsuji, Kodaira (JP);
Hideo Miwa, Kunitachi (JP);
Mitsuhiro Higuchi, Kokubunji (JP);
Koichi Imato, Higashimurayama (JP)

(73) Assignees: Hitachi, Ltd., Tokyo (JP); Hitachi ULSI Systems Co., Ltd., Kodaira (JP)

( * ) Notice: Subject to any disclaimer, the term of this patent is extended or adjusted under 35 U.S.C. 154(b) by 0 days.

(21) Appl. No.: 09/774,717

(22) Filed: Feb. 1, 2001

(65) Prior Publication Data

US 2001/0011753 A1 Aug. 9, 2001

(30) Foreign Application Priority Data

Feb. 1, 2000 (JP) ......................... 2000-024465

(51) Int. Cl.[7] ......................... H01L 29/76; H01L 29/94; H01L 31/062
(52) U.S. Cl. ......................... 257/401; 257/327; 257/337; 257/338
(58) Field of Search ............................ 257/327, 401, 257/337, 338

(56) References Cited

U.S. PATENT DOCUMENTS

| 5,567,553 | A | | 10/1996 | Hsu et al. | |
|---|---|---|---|---|---|
| 5,959,879 | A | * | 9/1999 | Koo | 257/295 |
| 6,043,540 | A | * | 3/2000 | Matsui et al. | 257/296 |
| 6,211,003 | B1 | * | 4/2001 | Taniguchi et al. | 438/224 |
| 6,346,439 | B1 | * | 2/2002 | Ahmad et al. | 438/231 |

OTHER PUBLICATIONS

1997 Symposium on VLSI Tech. Digest of Tech. Papers pp. 121–122.

Anomalous Gate Length Dependence of Threshold Voltage of Trench–Isolated Metal Oxide Semiconductor Field Effect Transistor. Oishi, et al 1998, L852–L854.

* cited by examiner

*Primary Examiner*—Amir Zarabian
*Assistant Examiner*—Kiesha Rose
(74) *Attorney, Agent, or Firm*—Antonelli, Terry, Stout & Kraues, LLP

(57) ABSTRACT

A gate electrode of each MISFET is formed on a substrate in an active region whose periphery is defined by an element isolation trench, and crosses the active region so as to extend from one end thereof to the other end thereof. The gate electrode has a gate length in a boundary region defined between the active region and the element isolation trench which is greater than a gate length in a central portion of the active region. The gate electrode is configured in an H-type flat pattern. Further, the gate electrode covers the whole of one side extending along a gate-length direction, of the boundary region defined between the active region L and the element isolation trench, and parts of two sides thereof extending along a gate-width direction. The MISFETs are formed in electrically separated wells and are connected in series to constitute part of a reference voltage generating circuit.

32 Claims, 14 Drawing Sheets

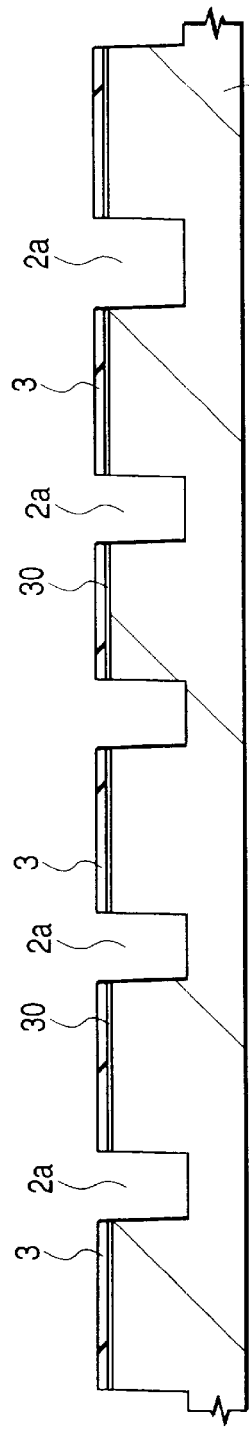
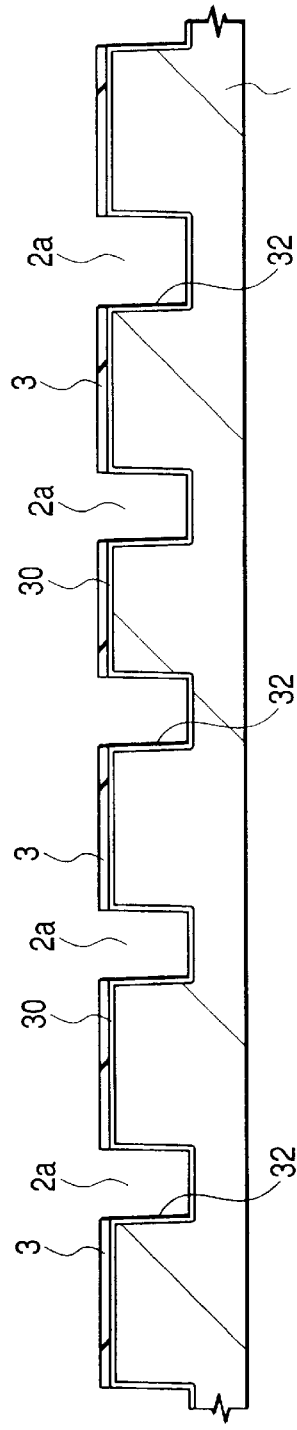
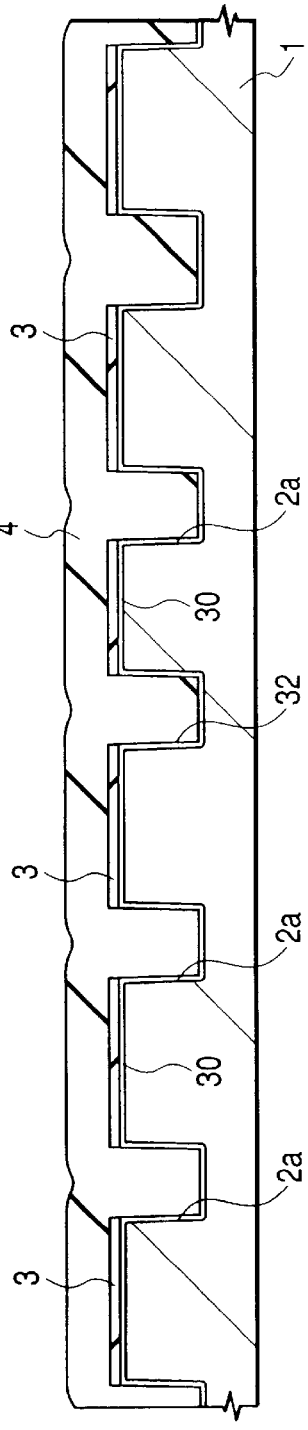

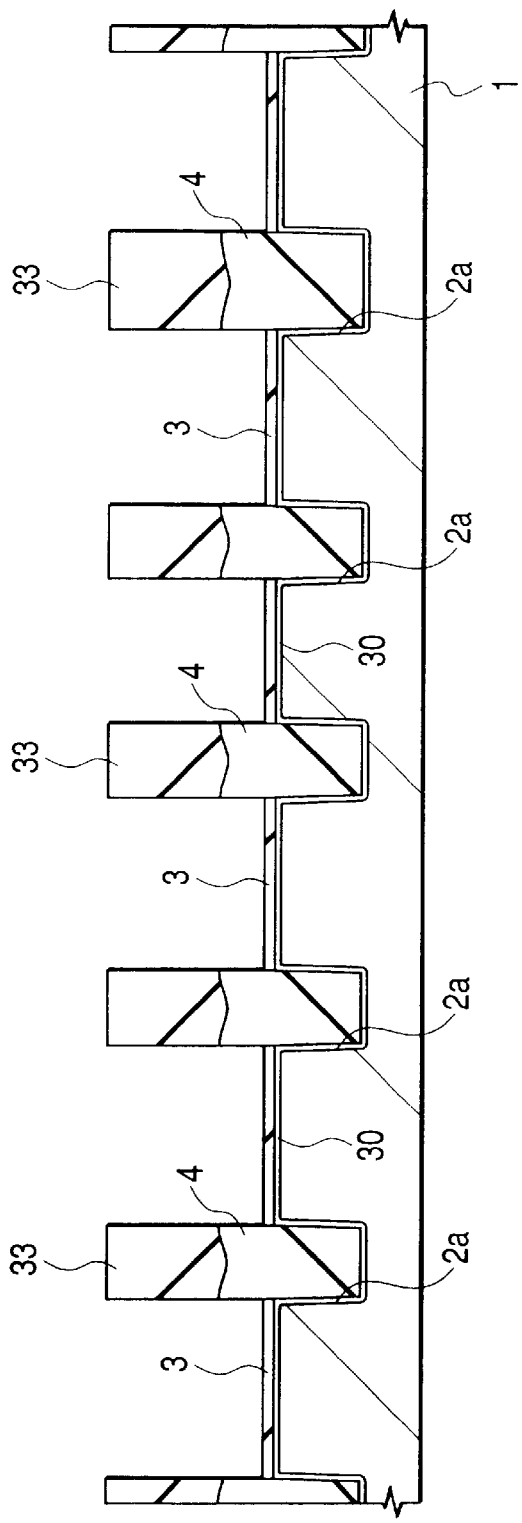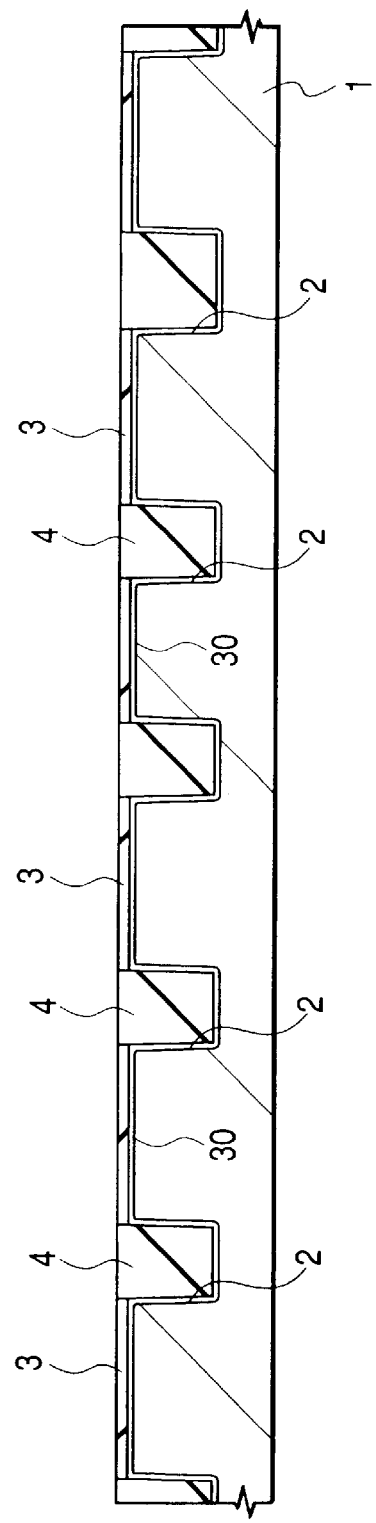

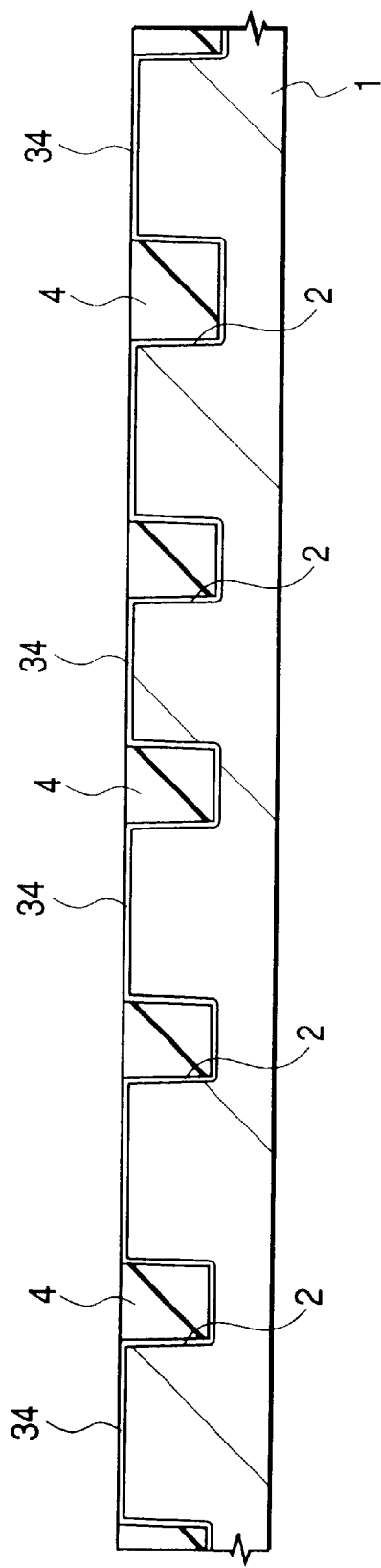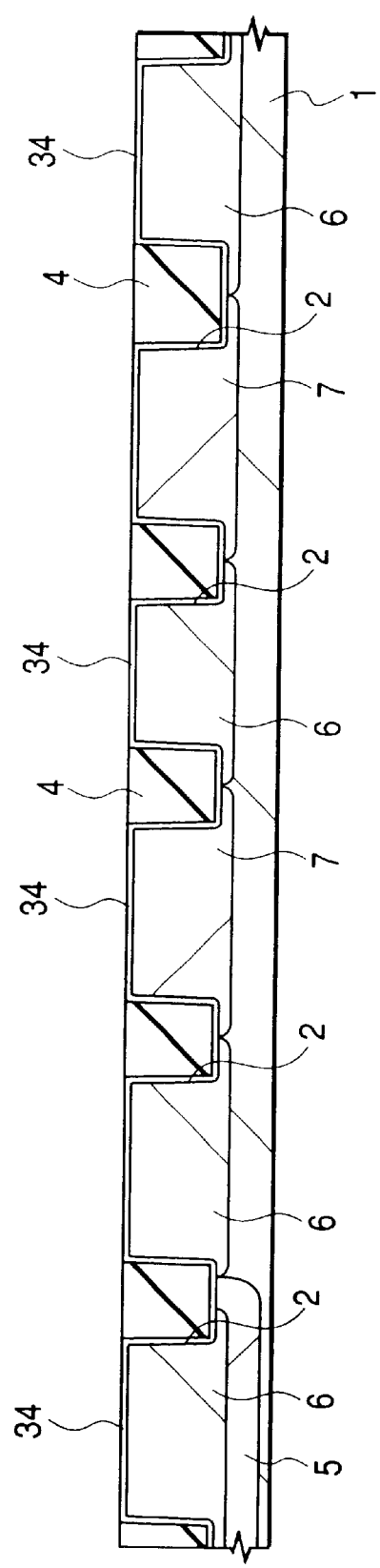

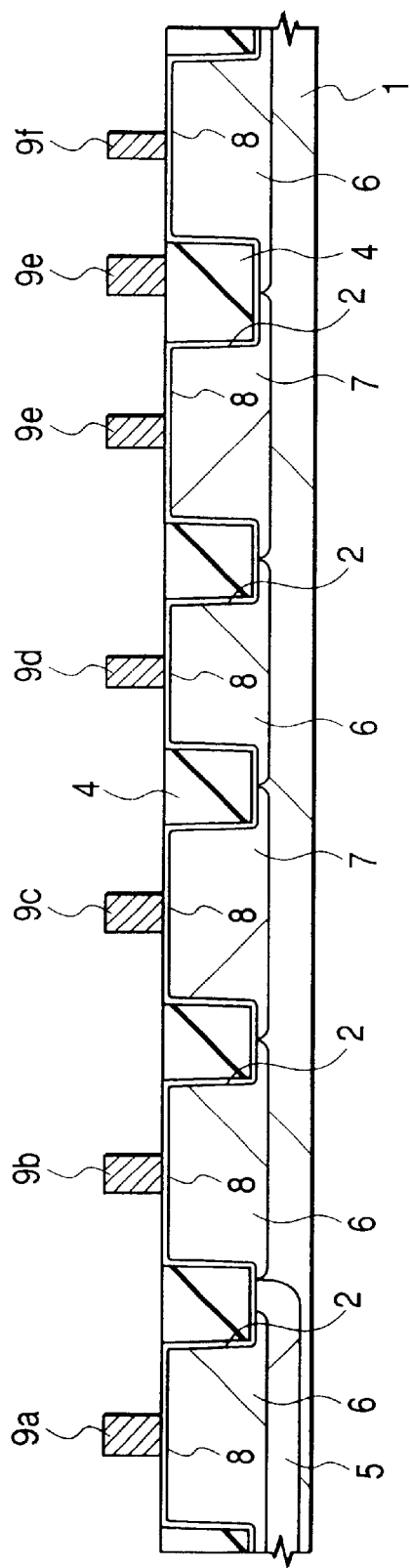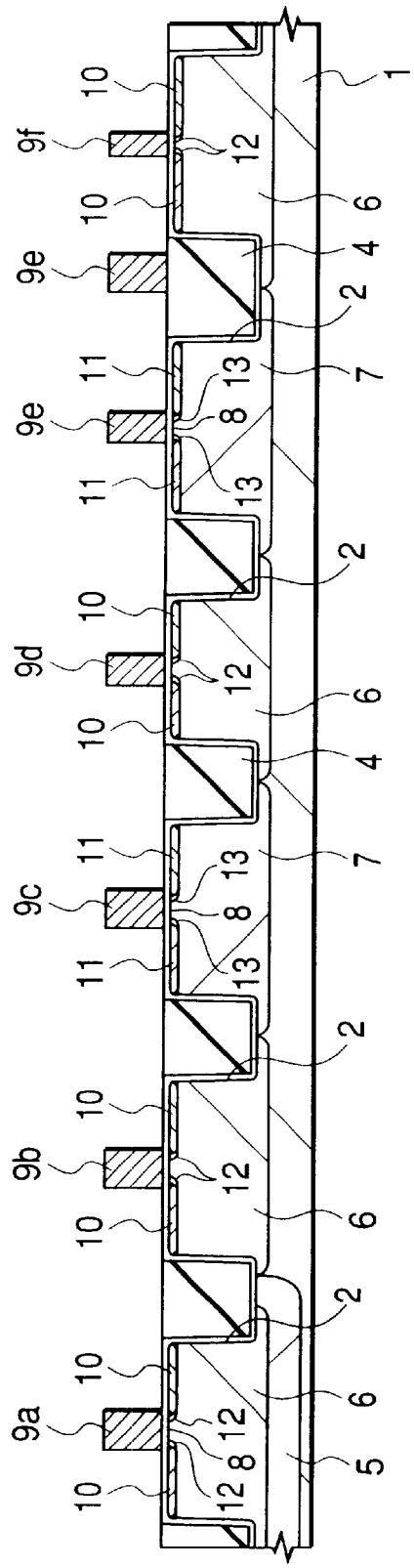

SEMICONDUCTOR INTEGRATED CIRCUIT DEVICE

The present invention relates to a semiconductor integrated circuit device and manufacturing technology related thereto; and, more particularly, the invention relates to a technology for reducing variations in threshold voltage of a scaled-down MISFET (Metal Insulator Semiconductor Field Effect Transistor).

BACKGROUND OF THE INVENTION

Element isolation trenches formed by embedding an insulating film, such as a silicon oxide film, into grooves or trenches defined in a semiconductor substrate have excellent advantages as compared with a field insulating film formed by a conventional selective oxidation (Local Oxidation of Silicon; LOCOS) method. Such element isolation trenches are advantageous even over the ensuring of sub-threshold characteristics, and reductions in junction leaks and back-gate effects, in that (a) element isolation intervals can be reduced, (b) control of element isolation film-thickness is easy and a field reversal voltage is easy to set, and (c) an impurity is implanted in the side walls and bottom in each trench in parts to thereby allow separation of an inversion-preventing layer from a diffused layer and a channel region for each element.

In order to define element isolation trenches in a semiconductor substrate (hereinafter referred to simply as a "substrate"), for example, the substrate is first etched with a silicon nitride film as a mask to thereby define grooves or trenches in the substrate in an element isolation region. Subsequently, a method is employed of depositing a silicon oxide film on the substrate so as to embed the silicon oxide inside the trenches, and, thereafter, the unnecessary silicon oxide film lying outside each trench is removed by chemical mechanical polishing (CMP). This type of technology has been described in, for example, 1997 Symposium on VLSI Tech. Digest of Tech. Papers pp. 121–122.

However, a problem has been pointed out in that a phenomenon (called "kink characteristic or hump characteristic", for example) occurs, such that, when a gate electrode of a MISFET (Metal Insulator Semiconductor Field Effect Transistor) is formed on (i.e., insulatedly on) the substrate with the element isolation trenches defined therein by using the above-described method, the threshold voltage (Vth) is locally reduced at an end of an active region brought into contact with each element isolation trench, and a channel is inverted at a low gate voltage (Vg) to thereby allow a drain current to flow.

The reduction in threshold voltage is considered to result from the fact that, for example, some of an impurity for threshold voltage control, which has been introduced into the substrate in the active region, is diffused into the silicon oxide film in each element isolation trench by in-manufacturing process heat treatment to thereby reduce the concentration of the impurity at each end of the active region, and the thickness of a gate insulator formed at each end of the active region becomes thin due to a reduction (recess) in the thickness of the silicon oxide film at the end of each element isolation trench, which occurs during the manufacturing process, whereby a high electric field concentrates on the thickness-reduced gate insulator.

Japanese Patent Application Laid-Open No. Hei 8-55985, showing Japanese Patent Application Publication corresponding to U.S. Pat. No. 5,567,553, discloses a technology in which, as a countermeasure against the problem that a leakage current increases in a cut-off region due to a reduction in threshold voltage, which is developed at an end of an active region, the gate length (channel length) of a gate electrode in a region, which crosses the boundary between the active region and each element isolation trench, is set longer than the gate length thereof in a central portion of the active region, whereby the threshold voltage at the end of the active region is set to substantially the same value as the threshold voltage in the central portion of the active region.

The article entitled "Anomalous Gate Length Dependence of Threshold Voltage of Trench-Isolated Metal Oxide Semiconductor Field Effect Transistor" (T. Oishi, K. Shiozawa, A. Furukawa, Y. Abe and Y. Tokuda, JJAP 37(1998) L852–L854) has discussed the influence of the concentration of an electric field on an end of an active region upon gate length dependence of a threshold voltage, using a gate electrode (I type gate) having a linear pattern and a gate electrode (H type gate) in which branch patterns extending in a direction orthogonal to the linear pattern are provided at both ends of the linear pattern and in which the linear pattern does not cross the boundary between the active region and each element isolation trench.

SUMMARY OF THE INVENTION

The present inventors have a low power consumption type SRAM (Static Random Access Memory) used as a data memory for a portable electronic device or the like in the works. In the present SRAM, a reference voltage generating circuit for generating a reference voltage (Vdd) from an external source voltage (Vcc) is provided as a part of the peripheral circuits. The reference voltage generating circuit is a circuit which comprises a plurality of enhancement type MISFETs and a plurality of depletion type MISFETs and which generates a reference voltage (Vdd) according to the difference between a threshold voltage of each enhancement type MISFET and a threshold voltage of each depletion type MISFET. Further, the MISFETs, which constitute the reference voltage generating circuit, are to be operated at a very small current, such as about 10 nA, to promote low power consumption as opposed to the case where MISFETs constituting another peripheral circuit, such as an input/output circuit, are operated at a current of about a few $\mu A$.

The fabrication of each MISFET to be operated at a small current needs to have the impurity concentration of the substrate increased in a region in which a channel for the MISFET is formed, as compared with that of the substrate in a region in which another MISFET is formed, thereby increasing the threshold voltage thereof. However, when the impurity concentration of the substrate in the channel-formed region is set high, the amount of diffusion of the impurity into the silicon oxide film at the end of the active region also increases, and the difference between the impurity concentration at the end of the active region and that in a central portion thereof becomes large. Therefore, a kink will be easily created due to the reduction in threshold voltage at the end of the active region in cooperation with a variation in the amount of a recess at an end of each element isolation trench, which is developed in a manufacturing process.

Since the MISFETs, which constitute the reference voltage generating circuit, are designed so as to operate with a small current, such a small kink as to offer no problem in another circuit operated at a relatively large current can also result in the occurrence of a circuit's malfunction. Particularly, since the reference voltage generating circuit adopts a circuit system wherein the reference voltage is generated according to a difference between the threshold voltage of each enhancement type MISFET and that of each depletion type MISFET, the reference voltage also varies when the threshold voltage of each MISFET varies due to the occurrence of the kink, whereby a desired reference voltage cannot be obtained. The reference voltage generating circuit brings about a problem in that, since an operating current therefor and a kink-based leakage current are substantially identical to each other in level, the reference voltage varies due to the occurrence of the kink.

An object of the present invention is to provide a technology capable of reducing a variation in threshold voltage of each scaled-down MISFET.

Another object of the present invention is to provide a technology capable of preventing a malfunction of a circuit comprised of MISFETs each operated at a small current.

The above, other objects and novel features of the present invention will become apparent from the description provided in the present specification and from the accompanying drawings.

A summary of typical aspects of the invention disclosed in the present application will be explained in brief as follows:

(1) There is provided a semiconductor integrated circuit device according to the present invention, comprising a first MISFET formed on a substrate in a first active region whose periphery is defined by an element isolation trench, and wherein a first gate electrode of the first MISFET, which crosses the first active region so as to extend from one end thereof to the other end thereof, is formed on (i.e., insulatedly on) the substrate in the first active region, the gate length of the first gate electrode in a boundary region defined between the first active region and the element isolation trench is greater than the gate length thereof in a central portion of the first active region, and the first gate electrode in the boundary region covers the whole or entirety of one side extending along a gate-length direction, of the boundary region and parts of two sides thereof extending along a gate-width direction.

(2) There is provided a semiconductor integrated circuit device according to the present invention, comprising a first MISFET formed on a substrate in a first active region whose periphery is defined by an element isolation trench, and a second MISFET formed on the substrate in a second active region whose periphery is defined by the element isolation trench, and wherein a first gate electrode of the first MISFET, which crosses the first active region so as to extend from one end thereof to the other end thereof, is formed on (i.e., insulatedly on) the substrate in the first active region, a second gate electrode of the second MISFET, which crosses the second active region so as to extend from one end thereof to the other end thereof, is formed on (i.e., insulatedly on) the substrate in the second active region, the gate length of the first gate electrode in a boundary region defined between the first active region and the element isolation trench is greater than a gate length thereof in a central portion of the first active region, and the gate length of the second gate electrode in a boundary region defined between the second active region and the element isolation trench is substantially equal to a gate length thereof in a central portion of the second active region.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

FIG. 9 is a fragmentary cross-sectional view of the substrate, which shows a subsequent step in the method of manufacturing the SRAM according one embodiment of the present invention;

FIG. 10 is a fragmentary cross-sectional view of the substrate, which shows a subsequent step in the method of manufacturing the SRAM according to one embodiment of the present invention;

FIG. 11 is a fragmentary cross-sectional view of the substrate, which shows a subsequent step in the method of manufacturing the SRAM according to one embodiment of the present invention;

FIG. 12 is a fragmentary cross-sectional view of the substrate, which shows a subsequent step in the method of manufacturing the SRAM according to one embodiment of the present invention;

FIG. 13 is a fragmentary cross-sectional view of the substrate, which shows a subsequent step in the method of manufacturing the SRAM according to one embodiment of the present invention;

FIG. 16 is a fragmentary cross-sectional view of the substrate, which shows a subsequent step in the method of manufacturing the SRAM according to one embodiment of the present invention;

FIG. 17 is a fragmentary cross-sectional view of the substrate, which shows a subsequent step in the method of manufacturing the SRAM according to one embodiment of the present invention;

FIG. 18 is a fragmentary cross-sectional view of the substrate, which shows a subsequent step in the method of manufacturing the SRAM according to one embodiment of the present invention;

FIG. 19 is a fragmentary cross-sectional view of the substrate, which shows a subsequent step in the method of manufacturing the SRAM according to one embodiment of the present invention;

DESCRIPTION OF THE PREFERRED EMBODIMENTS

Figure 1:
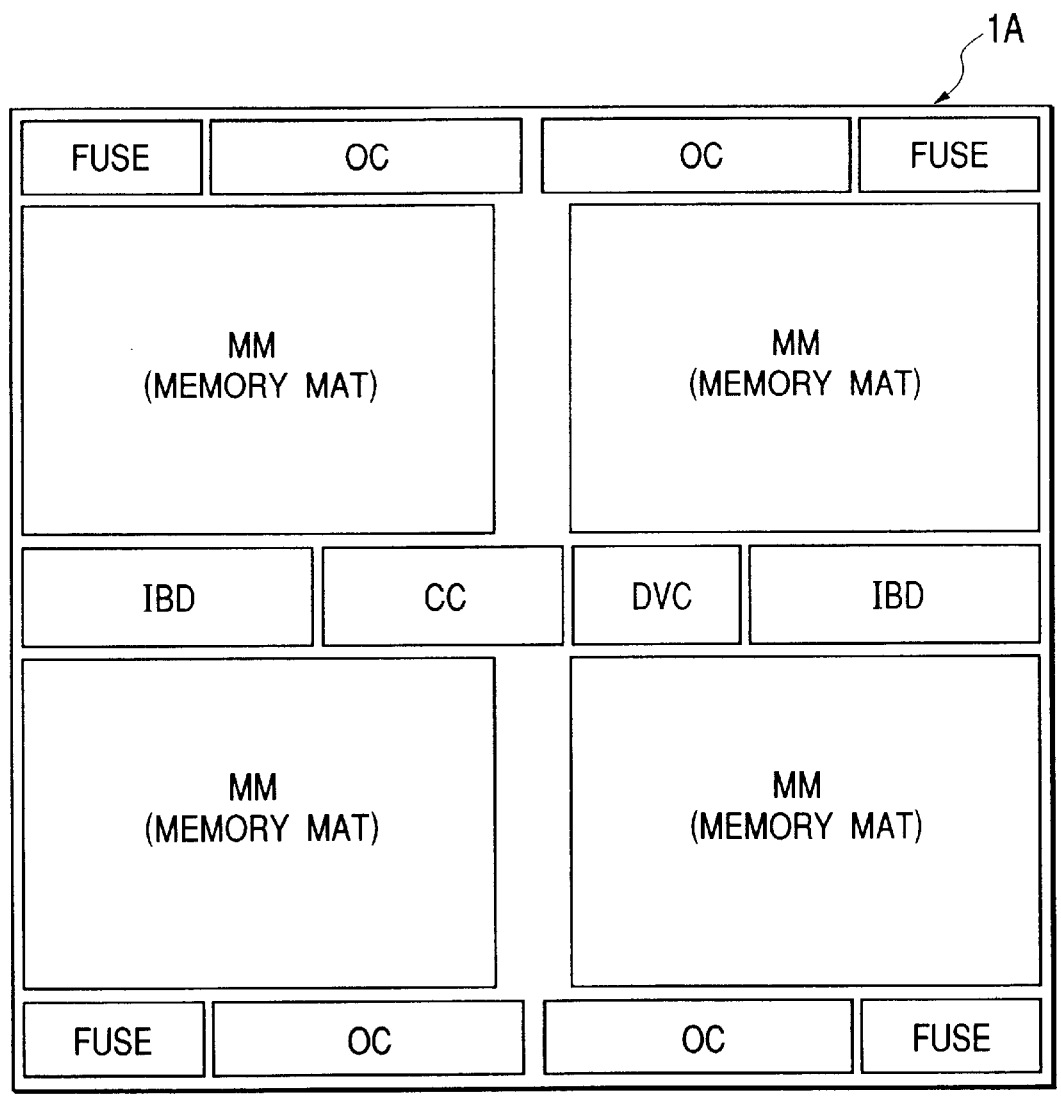
FIG. 1 is a block diagram of a semiconductor chip on which an SRAM representing one embodiment of the present invention is formed.

Preferred embodiments of the present invention will hereinafter be described in detail with reference to the accompanying drawings. Incidentally, elements having the same function in all of the drawings of the respective embodiments are identified by the same reference numerals and their repetitive description will therefore be omitted.

FIG. 1 is a block diagram of a semiconductor chip on which a SRAM according to the present embodiment is formed. A semiconductor chip 1A with the SRAM formed thereon is to be incorporated in a portable electronic device or the like. A storage unit divided into a plurality of memory mats MM, and peripheral circuits such as input/output circuits (input buffer decoders IBD, output circuits OC) IOC, a control circuit CC, and a reference voltage generator or generating circuit (step-down voltage circuit DVC) VC, etc., are formed on a main surface of the semiconductor chip 1A.

Figure 2:
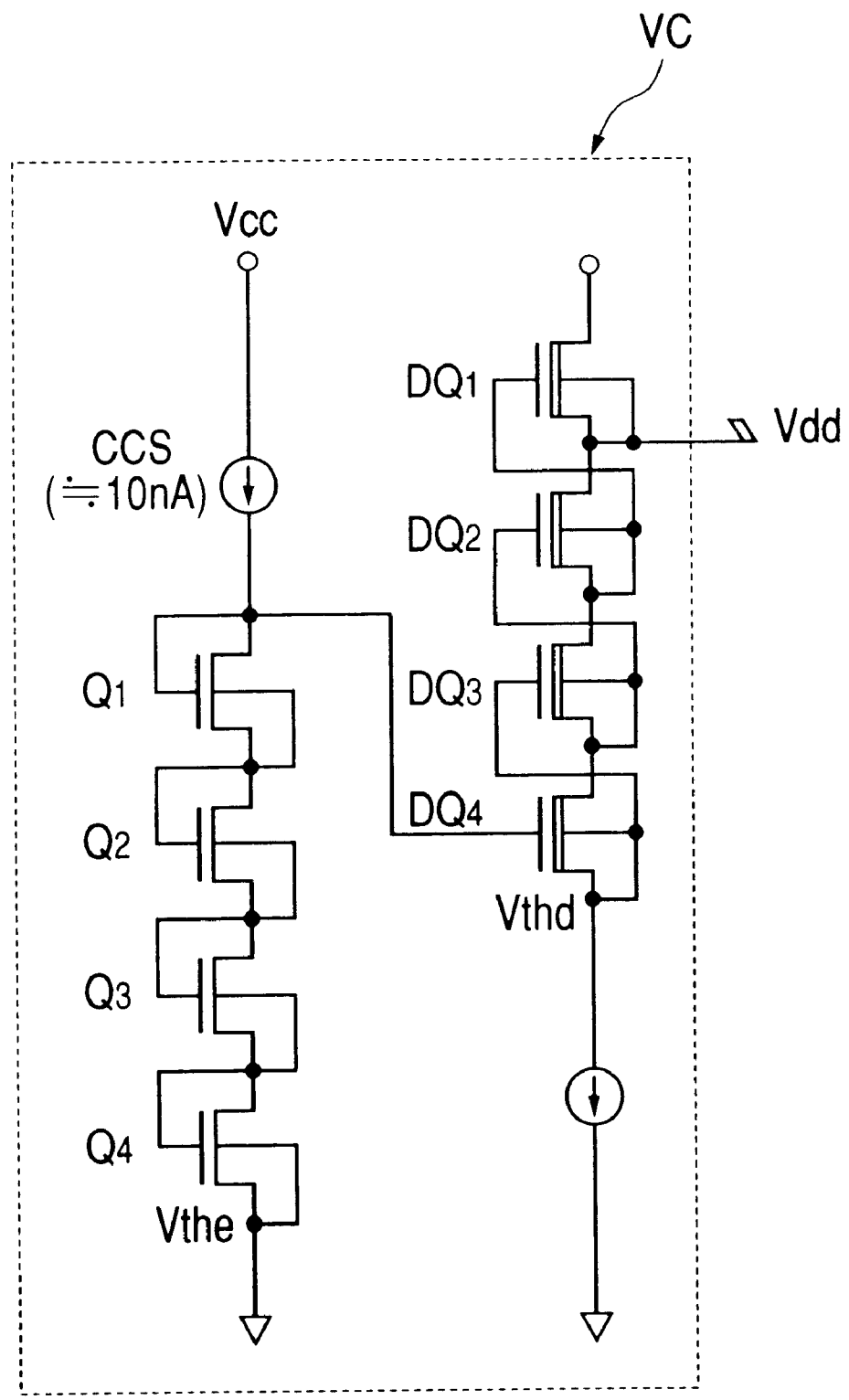
FIG. 2 is a circuit diagram illustrating a reference voltage generating circuit of the SRAM representing one embodiment of the present invention.

FIG. 2 is a diagram showing the reference voltage generating circuit VC of the SRAM. The reference voltage generating circuit comprises, for example, n channel type MISFETs ($Q_1$ through $Q_4$) connected in four stages and depletion type n channel type MISFETs ($DQ_1$ through $DQ_4$) connected in four stages in a manner similar to it, and it adopts a system which generates a reference voltage (Vdd) from an external source voltage (Vcc) according to the difference between each of threshold voltages (Vthe) of the enhancement type MISFETs ($Q_1$ through $Q_4$) and each of the threshold voltages (Vthd) of the depletion type MISFETs ($DQ_1$ through $DQ_4$). When, for example, the external source voltage is 5V, the respective threshold voltages (Vthe) of the enhancement type MISFETs ($Q_1$ through $Q_4$) are 0.4V, and the respective threshold voltages (Vthd) of the depletion type MISFETs ($DQ_1$ through $DQ_4$) are –0.5V, a reference voltage (Vdd) of 3.6V is generated based on a difference {4×(0.4–(–0.5))} between the threshold voltage (Vthe) and the threshold voltage (Vthd). Further, the MISFETs ($Q_1$ through $Q_4$ and $DQ_1$ through $DQ_4$), which constitute the reference voltage generating circuit VC, are respectively operated at a very small current of about 10 nA with respect to the operation of MISFETs of another peripheral circuit at a current of about a few µA to promote a reduction in power consumption. Incidentally, CCS in the drawing indicates a constant current source ≅10 nA).

Figure 3A:
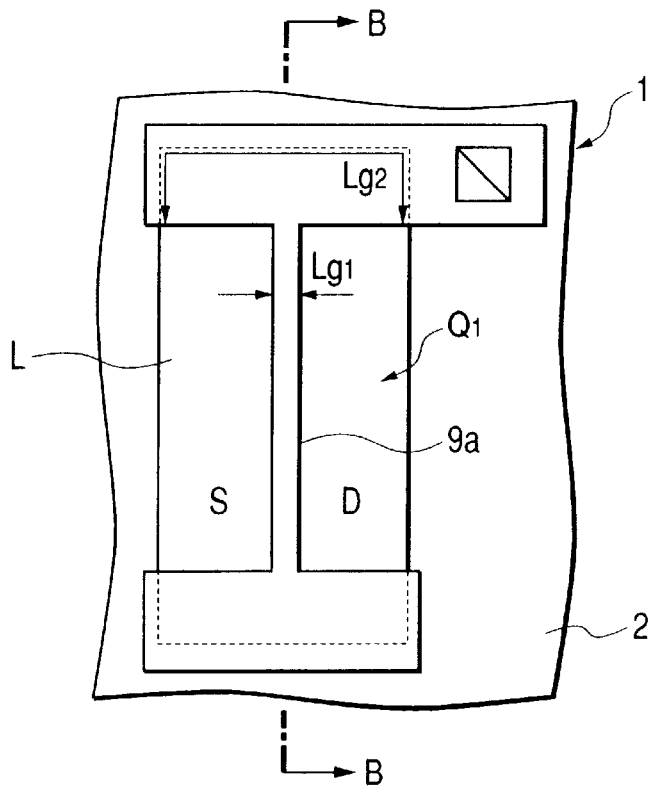
FIG. 3(a) is a plan view showing a gate electrode pattern of an enhancement type MISFET which constitutes part of the reference voltage generating circuit shown in FIG. 2.
Figure 3B:
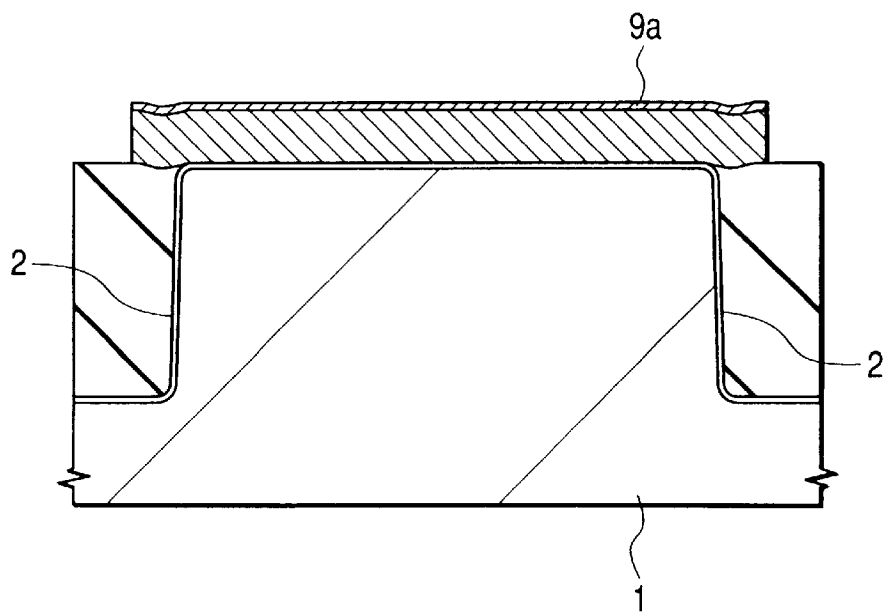
FIG. 3(b) is a cross-sectional view taken along line B—B of FIG. 3(a)

FIG. 3(a) is a plan view showing a gate electrode pattern of each of the enhancement type MISFETs ($Q_1$ through $Q_4$) which constitute part of the reference voltage generating circuit VC, and FIG. 3(b) is a cross-sectional view taken along line B—B of FIG. 3(a), respectively. While only the gate electrode of the MISFET ($Q_1$) is shown in FIG. 3(a), the gate electrodes of other MISFETs ($Q_2$ through $Q_4$) also have the same plane surface and sectional form, respectively. An active region on the left side of the gate electrode 9a is assumed to be a source (S) and an active region on the right side thereof is assumed to be a drain (D).

As shown in the drawing, the gate electrode 9a of the MISFET ($Q_1$) is formed on (i.e., insulatedly on) a substrate 1 in an active region L whose periphery is defined by an element isolation trench 2. Further, the gate electrode 9a, crosses the active region L so as to extend from one end thereof to the other end thereof in a direction extending along a gate width of the MISFET ($Q_1$). The gate electrode 9a is configured in an H-type plane pattern as a whole, in which a gate length ($Lg_2$) extending along a boundary region defined between the active region L and the element isolation trench 2 is larger than a gate length ($Lg_1$) lying in the central portion of the active region L. The gate length ($Lg_1$) of the gate electrode 9a, which exists in the central portion of the active region L, is 0.4 Fm, for example, whereas the gate width thereof is 10 Fm, for example. Further, the gate electrode 9a covers the whole of one side extending along the gate-length direction, of the boundary region defined between the active region L and the element isolation trench 2, and parts of two sides thereof extending along a gate-width direction. The gate electrode 9a comprises, for example, a polycide structure in which a Co (Cobalt) silicide layer is formed over a polycrystalline silicon film.

The gate length ($Lg_2$) of the gate electrode 9a configured in the above-described manner, which covers the whole of one side extending along the gate-length direction of the boundary region and the parts of the two sides extending along the gate-width direction, increases in threshold voltage. Therefore, the threshold voltage of the portion small in gate length in the central portion of the active region L results in the threshold voltage of the MISFET ($Q_1$). Namely, the threshold voltage of the MISFET ($Q_1$) is determined according to the gate length ($Lg_1$) in the central portion of the active region L. Therefore, as to the MISFET ($Q_1$) having the gate electrode 9a, a parasitic transistor low in threshold voltage is not formed in the boundary region by the influence of the diffusion of an impurity to each element isolation trench and a recess defined in an end of the element isolation trench, both of which occur in the course of a manufacturing process to be described later. Thus, since a variation in the threshold voltage of the MISFET ($Q_1$) is reduced, a reference voltage generating circuit VC, which generates a stable reference voltage (Vdd), can be implemented.

Figure 4A:
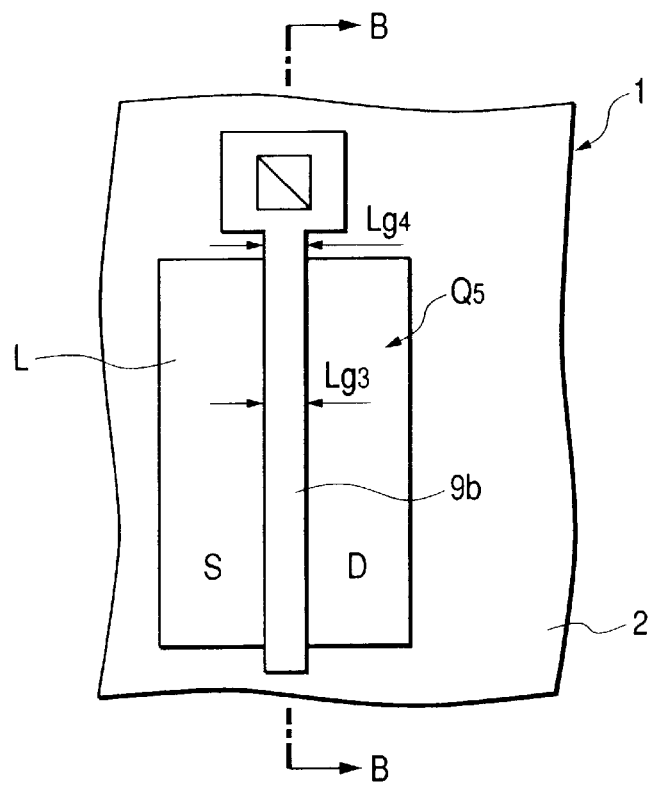
FIG. 4(a) is a plan view depicting a gate electrode pattern of an MISFET which constitutes an input/output circuit or logic circuit of the SRAM representing one embodiment of the present invention.
Figure 4B:
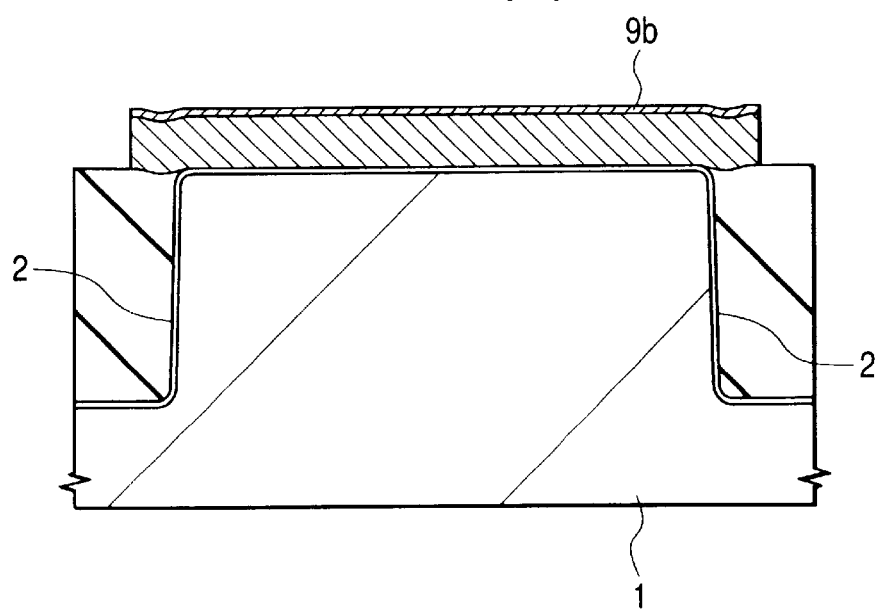
FIG. 4(b) is a cross-sectional view taken along line B—B of FIG. 4(a)

On the other hand, FIG. 4(a) is a plan view showing a gate electrode pattern of a MISFET ($Q_5$), which constitutes part of a peripheral circuit, other than the reference voltage generating circuit, e.g., a peripheral circuit or an input/output circuit IOC comprised of NAND and NOR logic circuits, and FIG. 4(b) is a cross-sectional view taken along line B—B of FIG. 4(a). While only a gate electrode of the MISFET (Q5) is shown in FIG. 4(a), gate electrodes of other MISFETS, which constitute the input/output circuit IOC or peripheral circuit, also have the same plane surface and sectional form respectively.

As shown in the drawing, the gate electrode 9b of the MISFET ($Q_5$) is formed on (i.e., insulatedly on) a substrate 1 in an active region L whose periphery is defined by an element isolation trench 2. Further, the gate electrode 9b crosses the active region L so as to extend from one end thereof to the other end thereof. The gate electrode 9b is configured in an I-type plane pattern as a whole, in which the gate length ($Lg_4$) in a boundary region defined between the active region L and the element isolation trench 2 is substantially equal to the gate length ($Lg_3$) lying in the central portion of the active region L. The gate electrode 9b comprises, for example, a polycide structure in which a Co silicide layer is formed over a polycrystalline silicon film. Further, the left side of the gate electrode 9b is supposed to be a source (S), whereas the right side thereof is supposed to be a drain (D).

In the gate electrode 9b configured in the above-described manner, the portion, which substantially serves as the gate electrode, comes into contact with the boundary region defined between the active region L and the element isolation trench 2. Therefore, a parasitic transistor is apt to be formed in the boundary region under the influence of the diffusion of an impurity to each element isolation trench and a recess defined in an end of the element isolation trench, both of which occur in the course of a manufacturing process. Namely, a small leakage current will flow between the source and drain along the boundary region defined between the active region L and the element isolation trench 2 below the gate electrode. However, since the MISFET ($Q_5$) employed in the NAND and NOR logic circuits is operated at a relatively large current as compared with the MISFETs ($Q_1$ through $Q_4$ and $DQ_1$ through $DQ_4$) employed in the reference voltage generating circuit, a problem associated with malfunctions of the logic circuits does not arise even if a small leakage current exists.

Figure 5:
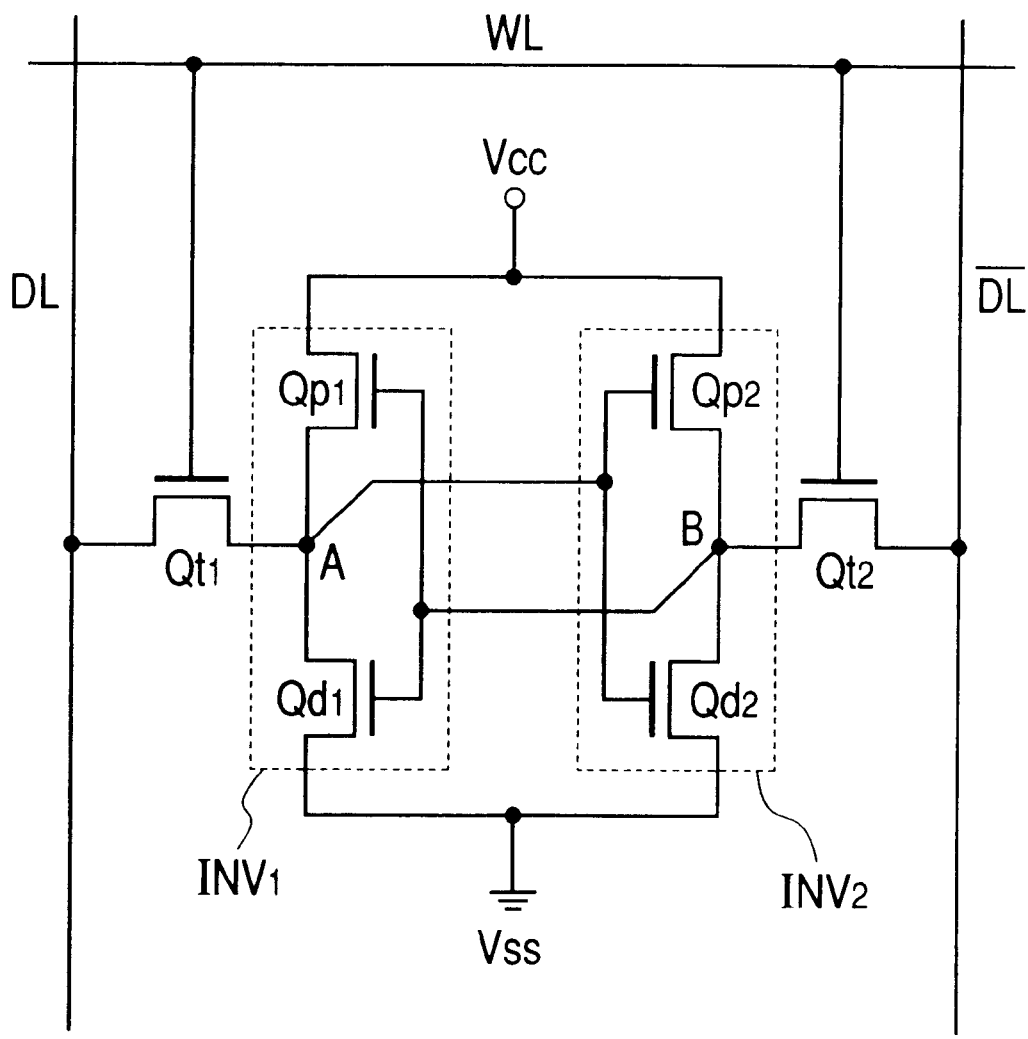
FIG. 5 is an equivalent circuit diagram of a memory cell of the SRAM according one embodiment of the present invention.

FIG. 5 is an equivalent circuit diagram of a memory cell MC of the SRAM. The present memory cell MC comprises a pair of drive MISFETs ($Qd_1$ and $Qd_2$), a pair of load MISFETs ($Qp_1$ and $QP_2$), and a pair of transfer MISFETs ($Qt_1$ and $Qt_2$), which are disposed at portions where a pair of complementary data lines (DL and /DL) and a word line (WL) intersect. The drive MISFETs ($Qd_1$ and $Qd_2$) and the transfer MISFETs ($Qt_1$ and $Qt_2$) are respectively comprised of n channel type MISFETS, and the load MISFETs ($Qp_1$ and $QP_2$) are respectively comprised of p channel type MISFETs. Namely, the memory cell MC comprises a CMOS (complementary MOS) which makes use of the four n channel type MISFETs and the two p channel type MISFETs. The CMOS type memory cell MC is characterized in that, since a leakage current at standby is less than that compared with a load-resistance type memory cell using four n channel type MISFETs and two high-resistance load elements, the power consumption is low.

Of the six MISFETs constitutive of the memory cell MC, the drive MISFET $Qd_1$ and the load MISFET $Qp_1$ constitute a first inverter ($INV_1$), whereas the drive MISFET $Qd_2$ and the load MISFET $QP_2$ constitute a second inverter ($INV_2$). These inverters ($INV_1$ and $INV_2$) provided in a pair are cross-connected to each other within the memory cell and constitute a flip-flop circuit used as an information storage unit for storing one-bit information therein.

One input/output terminal of the flip-flop circuit is electrically connected to one of the source and drain of the transfer MISFET $Qt_1$, whereas the other input/output terminal thereof is electrically connected to one of the source and drain of the transfer MISFET $Qt_2$. The other of the source and drain of the transfer MISFET $Qt_1$ is electrically connected to the data line DL, and the other of the source and drain of the transfer MISFET Qt2 is electrically connected to the data line /DL. One end (corresponding to each of ones of the sources and drains of the two load MISFETs $Qp_1$ and $QP_2$) of the flip-flop circuit is connected to a source voltage (Vcc) of 5V, for example, whereas the other thereof is connected to a GND voltage of 0V, for example.

Figure 6:
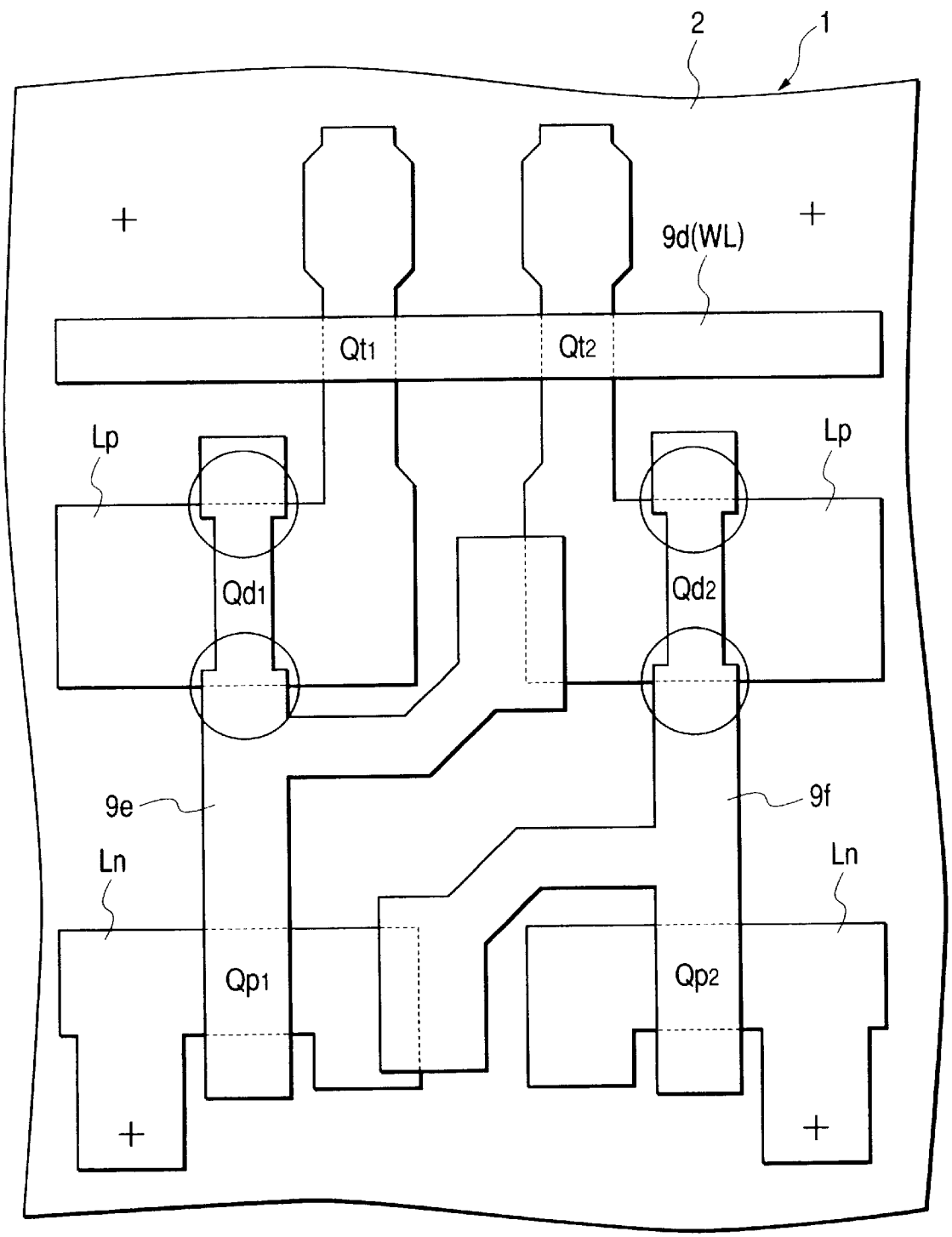
FIG. 6 is a plan view depicting gate electrode patterns of MISFETs which constitute the memory cell of the SRAM according to one embodiment of the present invention.

FIG. 6 is a plan view showing gate electrode patterns of the six MISFETs which constitute the memory cell MC. Incidentally, a rectangular region formed by connecting four+marks shown in the drawing with straight lines indicates a region corresponding to one memory cell.

The six MISFETs (drive MISFETs $Qd_1$ and $Qd_2$, load MISFETs $Qp_1$ and $QP_2$ and transfer MISFETs $Qt_1$ and $Qt_2$), which constitute the memory cell MC, are formed in active regions (Ln and Lp) whose peripheries are surrounded by an element isolation trench 2 defined in a main surface of a substrate 1. The drive MISFETs $Qd_1$ and $Qd_2$ and transfer MISFETs $Qt_1$ and $Qt_2$ each comprised of an n channel type are formed in their corresponding active regions Lp in which p type wells are formed. The load MISFETs $Qp_1$ and $QP_2$ each comprised of a p channel type are formed in active regions Ln in which n type wells are formed.

The transfer MISFETs $Qt_1$ and $Qt_2$ have a gate electrode 9d formed integrally with a word line WL. The drive MISFET $Qd_1$ and load MISFET $Qp_1$, which constitute the first inverter ($INV_1$) of the flip-flop circuit, have a common gate electrode 9e. The drive MISFET $Qd_2$ and the load MISFET $QP_2$, which constitute the second inverter (INV2), have a common gate electrode 9f.

Of the gate electrode 9e common to the drive MISFET $Qd_1$ and the load MISFET $Qp_1$, a portion used as a gate electrode of the drive MISFET $Qd_1$ is smaller than a portion used as a gate electrode of the load MISFET $Qp_1$ in gate length and is larger than that in gate width. Of the gate electrode 9e as well, a portion used as a gate electrode of the drive MISFET $Qd_1$ has a gate length in a boundary region (corresponding to a region indicated by each mark ○ in the drawing) formed between the active region Lp and the element isolation trench 2, which gate length is larger than the gate length in the central portion of the active region Lp.

Of the gate electrode 9f common to the drive MISFET $Qd_2$ and the load MISFET $QP_2$ in the same manner as described above, a portion used as a gate electrode of the drive MISFET $Qd_2$ is smaller than a portion used as a gate electrode of the load MISFET $QP_2$ in gate length and larger than that in gate width. Of the gate electrode 9f as well, a portion used as a gate electrode of the drive MISFET $Qd_2$ has a gate length in a boundary region (corresponding to a region indicated by each mark ○ in the drawing) formed between the active region Lp and the element isolation trench 2, which gate length is larger than a gate length in the central portion of the active region Lp.

The respective gate electrodes 9d through 9f of the six MISFETs, which constitute the memory cell MC, are respectively comprised of a polycide structure wherein a cobalt (Co) silicide layer is formed over a polycrystalline silicon film, for example.

In the gate electrodes 9e and 9f of the pair of drive MISFETs ($Qd_1$ and $Qd_2$), the gate lengths thereof lying in the boundary regions between the active regions Lp and the element isolation trench 2 are larger than those in the central portions of the active regions Lp. Therefore, even if a parasitic transistor is formed in each boundary region due to the influence of the diffusion of an impurity to each element isolation trench and a recess defined in an end of the element isolation trench, both of which occur in the course of a manufacturing process, a drain current, which flows in a channel at the boundary, is low as compared with the case in which the gate length in the boundary region is set substantially identical to the gate length in the central portion of the active region Lp. Namely, the gate electrodes $9e$ and $9f$ of the drive MISFETs ($Qd_1$ and $Qd_2$) are set to such shapes as described above, whereby a malfunction of the memory cell due to a variation in threshold voltage is less likely, and the ratio of acquisition of a chip is improved. It is therefore possible to improve manufacturing yields of the SRAM. Further, since the leakage currents of the drive MISFETs ($Qd_1$ and $Qd_2$) can be reduced, power consumption of the memory cell can be reduced.

A method of manufacturing MISFETs which constitute the memory cell MC and peripheral circuits of the SRAM will next be explained with reference to FIGS. 7 through 21. Incidentally, an n channel type MISFET ($Q_1$), which constitutes part of a reference voltage generating circuit VC, an n channel type MISFET $Q_5$ and a p channel type MISFET $Q_6$, which constitute part of an input/output circuit IOC, a transfer MISFET $Qt_1$, a load MISFET $Qp_1$, and a drive MISFET $Qd_2$ are arranged in order as viewed from the left side in these drawings.

Figure 7:
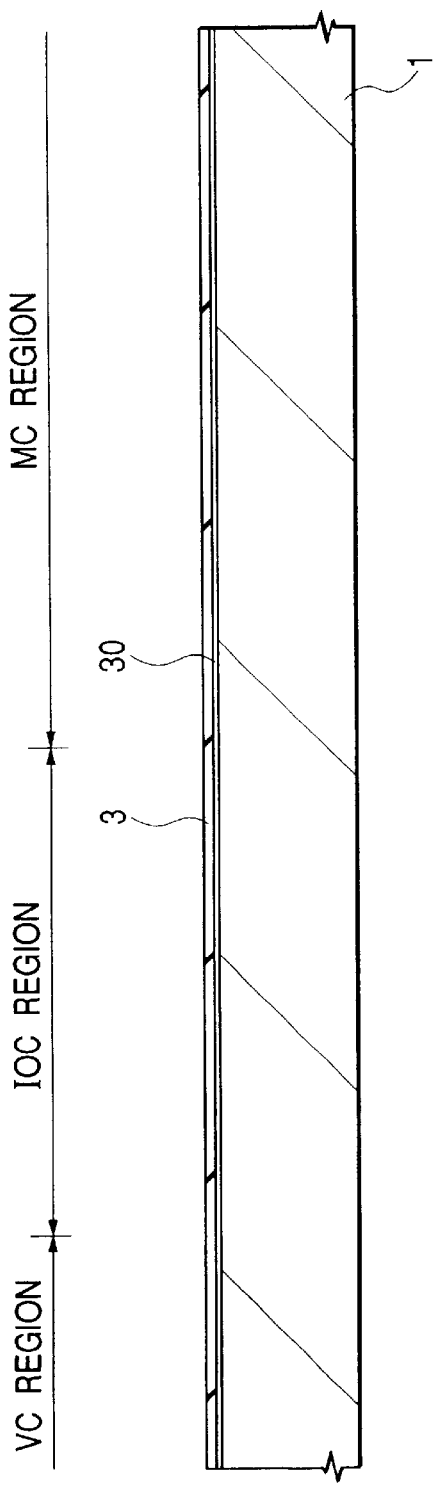
FIG. 7 is a fragmentary cross-sectional view of a substrate, which shows a step in the method of manufacturing the SRAM according one embodiment of the present invention.

As shown in FIG. 7, a substrate 1 comprised of p type monocrystalline silicon having a resistivity of from about 1 Ωcm to about 10 Ωcm, for example, is first subjected to thermal oxidation at about 850° C. to thereby form a thin silicon oxide film 30 having a thickness of about 10 nm on the surface of the substrate 1. Afterwards, a silicon nitride film (resistance-to-oxidation film) 3 having a thickness of about 120 nm is deposited over the silicon oxide film 30 by a CVD method. The silicon nitride film 3 is used as a mask upon forming trenches by etching the substrate 1 in an element isolation region. Further, since the silicon nitride film 3 has the property of being hard to be oxidized, it is also used as a mask for preventing the oxidation of the surface of the substrate 1, which is located therebelow. The silicon oxide film 30 located below the silicon nitride film 3 is formed to relax a stress developed in the interface between the substrate 1 and the silicon nitride film 3 and prevent the occurrence of a defect, such as a dislocation in the surface of the substrate 1 due to the stress.

Figure 8:
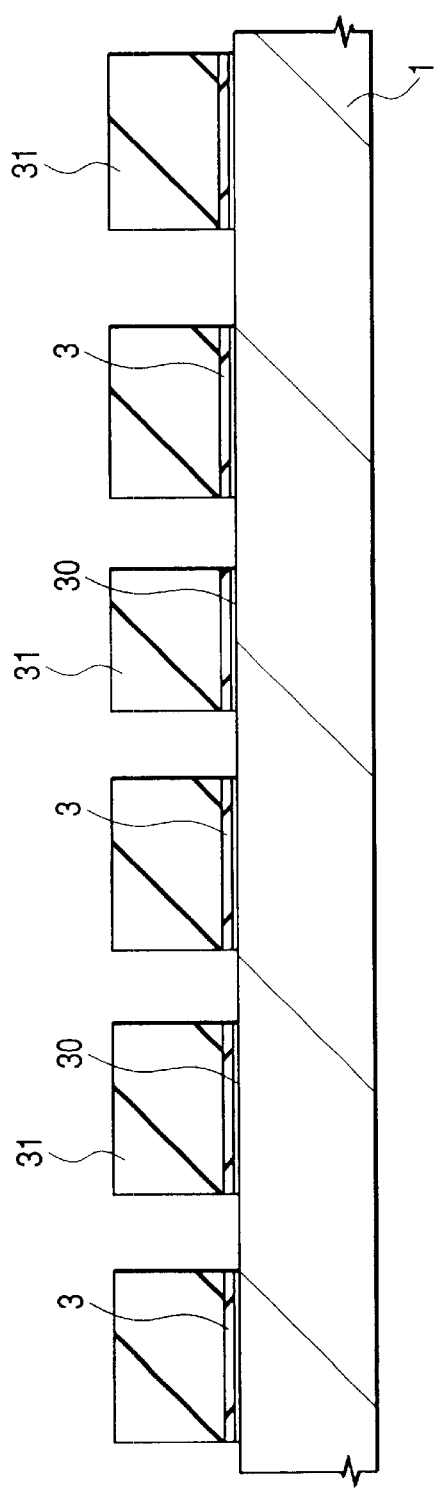
FIG. 8 is a fragmentary cross-sectional view of the substrate, which shows a subsequent step in the method of manufacturing the SRAM according to one embodiment of the present invention.

Next, as shown in FIG. 8, the silicon nitride film 3 in the element isolation region and the silicon oxide film 30 provided therebelow are selectively removed by dry etching using a photoresist film 31 as a mask to thereby expose the surface of the substrate 1.

After the photoresist film 31 is removed by ashing, trenches $2a$ each having a depth of about 350 nm to about 400 nm are next defined in the substrate 1 in the element isolation region by dry etching using the silicon nitride film 3 as a mask, as shown in FIG. 9.

Next, etching residues attached to inner walls of the trenches $2a$ are removed by cleaning using dilute hydrofluoric acid or the like. Thereafter, the substrate 1 is subjected to thermal oxidation at a temperature of about 800° C. to about 1000° C., whereby thin silicon oxide films 32 each having a thickness of about 10 nm are formed on the inner walls of the trenches $2a$ as shown in FIG. 10. The silicon oxide films 32 are formed to recover damage of dry etching developed in the inner walls of the trenches $2a$ and relax a stress developed in the interface between a silicon oxide film embedded inside each trench $2a$ in a subsequent process and the substrate 1.

Next, as shown in FIG. 11, the silicon oxide film 4 is deposited on the substrate 1 including the interiors of the trenches $2a$ by the CVD method. The silicon oxide film 4 is deposited with a thickness (of about 450 nm to about 500 nm, for example) which is thicker than the depth of the trench $2a$ to thereby completely bury the interiors of the trenches $2a$ with the silicon oxide film 4. The silicon oxide film 4 is formed by a deposition method having excellent step coverage, as in the case of a silicon oxide film deposited by using oxygen and tetraethoxysilane (($C_2H_5$)$_4$Si), for example.

Next, the substrate 1 is thermally oxidized at about 1000° C. and subjected to densification for improving the quality of the silicon oxide film 4 embedded in each trench $2a$. Afterwards, the silicon oxide film 4 formed above each silicon nitride film 3 is removed by dry etching using each photoresist film 33 as a mask, as shown in FIG. 12. Patterns of the photoresist films 33 are set as reversal patterns of the photoresist films 31 used when the silicon nitride film 3 in the element isolation region is dry-etched.

Next, the photoresist films 33 are removed. Thereafter, the silicon oxide film 4 formed above each trench $2a$ is polished by a chemical mechanical polishing (CMP) method, as shown in FIG. 13, to flatten the surface thereof, thereby forming element isolation trenches 2. This polishing is carried out by using each silicon nitride film 3 covering the surface of the substrate 1 in each active region as a stopper. This polishing is completed when the height of the surface of the silicon oxide film 4 becomes equal to that of each silicon nitride film 3.

Figure 14:
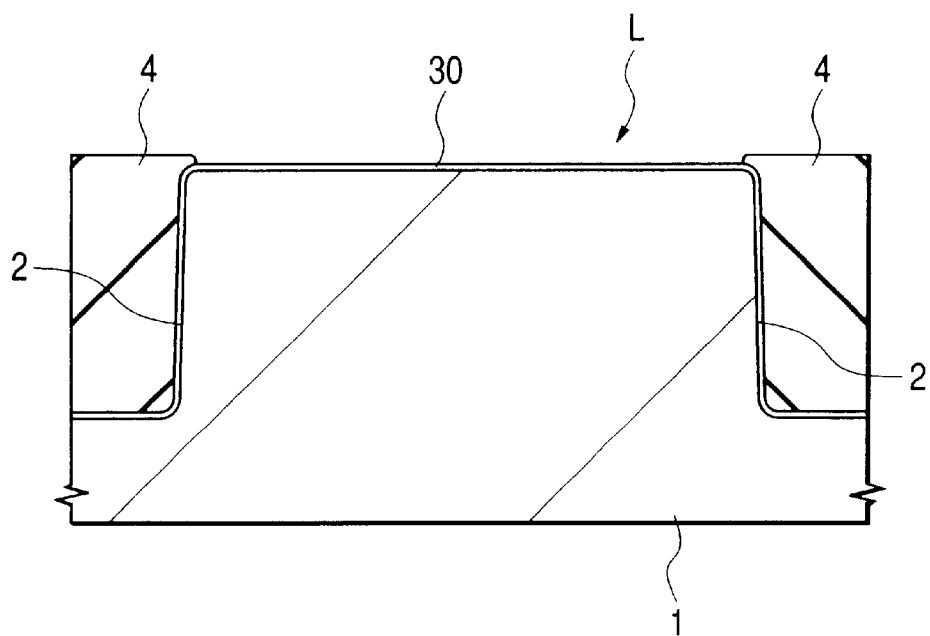
FIG. 14 is a fragmentary cross-sectional view of the substrate, which shows a subsequent step in the method of manufacturing the SRAM according to one embodiment of the present invention.
Figure 15:
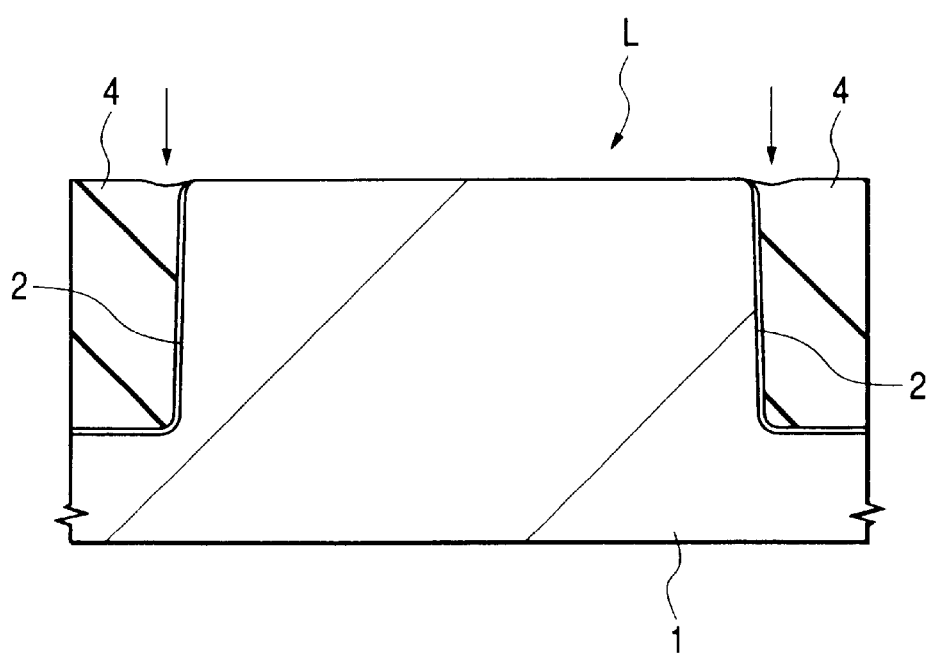
FIG. 15 is a fragmentary cross-sectional view of the substrate, which shows a subsequent step in the method of manufacturing the SRAM according to one embodiment of the present invention.

Next, the silicon nitride film 3, which covers the surface of the substrate 1 in each active region, is removed by hot phosphoric acid to thereby expose the silicon oxide film 30 formed therebelow. When the silicon nitride film 3 is removed, an offset or step equivalent to the thickness of the silicon nitride film 3 is developed between the surface of the silicon oxide film 30 formed on the surface of the substrate 1 in each active region and the surface of the silicon oxide film 4 embedded in each element isolation trench 2, as shown in FIG. 14 in an enlarged form.

Next, the surface of the silicon oxide film 4 embedded in each element isolation trench 2 is wet-etched by hydrofluoric acid to thereby reduce the step formed between the surface of the silicon oxide film 4 and the surface of the substrate 1 in each active region. At this time, the thin silicon oxide film 30 formed on the substrate 1 in the active region is also etched to expose the surface of the substrate 1. Since the sides of the silicon oxide film 4 in each location brought into contact with the silicon nitride film 3 are also subjected to the hydrofluoric acid as well as its upper surface, the etched amount of silicon oxide film 4 increases as compared with the silicon oxide film 4 in each region away from the active region. Thus, the surfaces (corresponding to locations indicated by arrows) of the silicon oxide films 4 in the neighborhood of ends of the element isolation trenches 2 are withdrawn (recessed) downward.

Next, as shown in FIG. 16, the substrate 1 is subjected to thermal oxidation at about 850° C. to form a thin silicon oxide film 34 having a thickness of about 10 nm on the surface of the substrate 1 in each active region. The silicon oxide film 34 is formed to lessen damage of the substrate 1 due to the impurity ion implantation to be next carried out.

Subsequently, an n-type impurity (e.g., phosphor) is implanted in one part of the substrate 1 through the silicon oxide film 34 and a p-type impurity (boron) is implanted in the other part thereof in order to form wells (p-type and n-type wells) in the substrate 1. In order to control a threshold voltage of each MISFET, the p-type impurity (boron) is implanted in the substrate 1 through the silicon oxide film 34. The impurity for forming the wells is introduced into a deep region of the substrate 1 with high energy, whereas the impurity for controlling the threshold voltage is introduced into a shallow region of the substrate 1 with low energy.

Next, as shown in FIG. 17, the substrate 1 is subjected to heat treatment at about 950° C. to extend and diffuse the impurity, whereby an n-type well 5 is formed in a deep region of the substrate 1 in the reference voltage generating circuit region, and a p-type well 6 is formed in a shallow region thereof. Further, the p-type wells 6 and n-type wells 7 are formed in the substrate 1 in the memory cell region, and the p-type and n-type wells 6 and 7 are formed in the substrate 1 in the input/output circuit region. In the reference voltage generating circuit region, the n-type well 5 is formed so as to surround the periphery of each p-type well 6, whereby the p-type well 6 is electrically isolated from the p-type substrate 1.

Next, the silicon oxide film 34 formed on the corresponding surface of the substrate 1 is removed by wet etching using hydrofluoric acid. Thereafter, as shown in FIG. 18, the substrate 1 is thermally oxidized at a temperature of about 800° C. to about 850° C. to thereby form clean gate oxide films 8 on the corresponding surfaces of the p-type and n-type wells 6 and 7. Afterwards, gate electrodes 9a through 9f are formed over the corresponding gate oxide films 8. The gate electrodes 9a through 9f are formed by depositing a polycrystal silicon film having a thickness of about 200 nm to about 250 nm over the gate oxide films 8 by the CVD method and thereafter dry-etching the polycrystal silicon film using photoresist films as masks.

The gate electrode 9a of the MISFET ($Q_1$), which constitutes part of the reference voltage generating circuit VC, is formed by the pattern shown in FIG. 3(a). The gate electrode 9b of the MISFET ($Q_5$), which constitutes part of the input/output circuit IOC, is formed by the pattern shown in FIG. 4(a). The gate electrodes 9d through 9f of the drive MISFET $Qd_2$, load MISFET $Qp_1$ and transfer MISFET $Qt_1$, which constitute the memory cell MC, are respectively formed by the patterns shown in FIG. 6.

The gate length of the gate electrode 9a of the MISFET ($Q_1$), which constitutes part of the reference voltage generating circuit VC, is 0.4 μm, for example, and the gate width thereof is 10 μm, for example. The gate electrode 9a formed in such a slender pattern is apt to fall down when it undergoes vibrations in a cleaning process or the like subsequent to gate processing. Since, however, the gate lengths of both ends of the gate electrode 9a are set larger than the gate length of its central portion, the present embodiment is characterized in that the portion short in gate length, of the central portion, is hard to fall down.

Next, as shown in FIG. 19, a phosphor (P) ion is implanted in its corresponding each p-type well 6 to form an n-type semiconductor region 10 having a low impurity concentration. Further, a boron (B) ion is implanted in its corresponding each n-type well 7 to form a p⁻ type semiconductor region 11 having a low impurity concentration. Subsequently, the boron (B) ion is implanted in its corresponding each p-type well 6 to form a pocket region 12 comprised of a p type semiconductor region which functions as a punch through stopper. Further, the phosphor (P) ion is implanted in its corresponding n-type well 7 to form a pocket region 13 comprised of an n type semiconductor region which functions as a punch through stopper.

Figure 20:
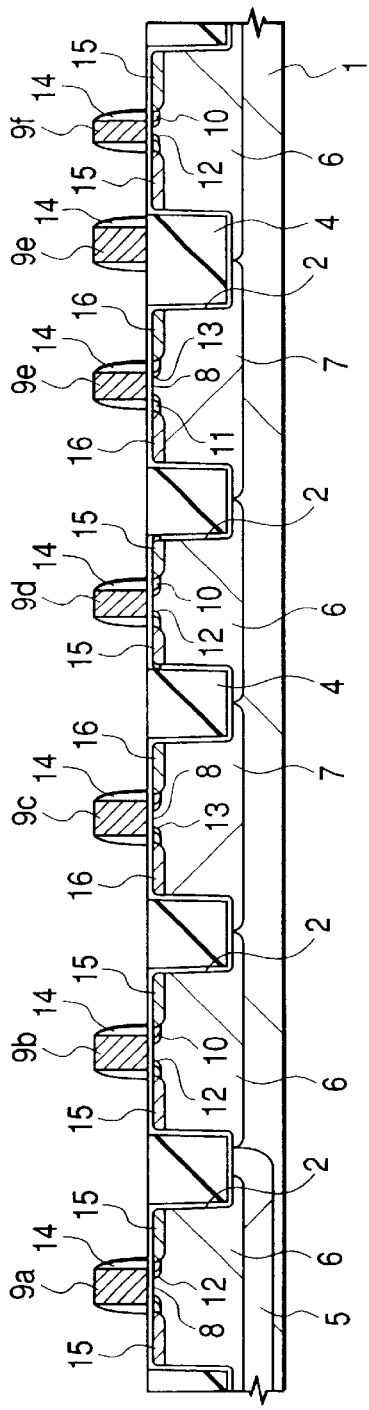
FIG. 20 is a fragmentary cross-sectional view of the substrate, which shows a subsequent step in the method of manufacturing the SRAM according to one embodiment of the present invention.
Figure 21:
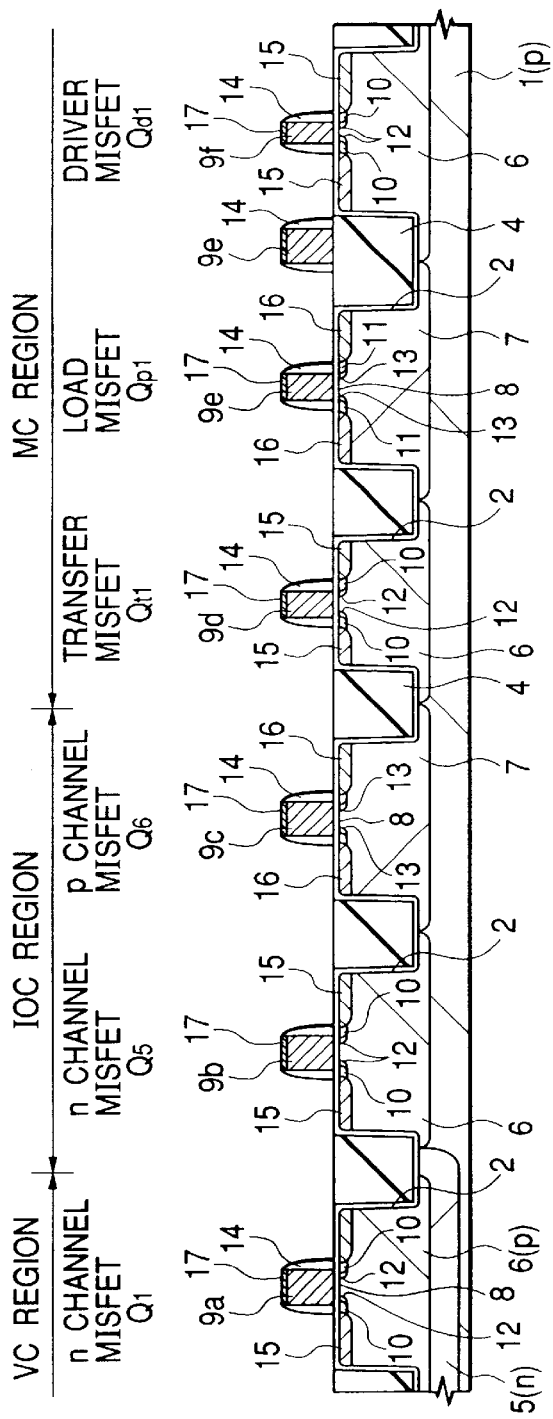
FIG. 21 is a fragmentary cross-sectional view of the substrate, which shows a subsequent step in the method of manufacturing the SRAM according to one embodiment of the present invention.

Next, as shown in FIG. 20, side wall spacers 14 are formed on the corresponding side walls of the gate electrodes 9d through 9f. Afterwards, the boron (B) ion is implanted in each corresponding n-type well 7 to form p⁺ type semiconductor regions (source and drain) each having a high impurity concentration. Further, an arsenic (As) ion is implanted in the corresponding p-type well 6 to form n⁺ type semiconductor regions (source and drain) each having a high impurity concentration. Thereafter, a Co silicide layer 17 is formed on the surfaces of the gate electrodes 9d through 9f, n⁺ type semiconductor regions (source and drain) 15 and p⁺ type semiconductor regions (source and drain) 16 to thereby complete each of the individual MISFETs, as shown in FIG. 21.

The n channel type MISFET ($Q_1$), which constitutes the reference voltage generating circuit VC shown in FIG. 21, will now be described. As shown in FIG. 21, the source of the n channel type MISFET ($Q_1$) and the p-type well 6 in which the n channel type MISFET ($Q_1$) is formed, are electrically connected to each other. Further, the p-type well 6 in which the n channel type MISFET ($Q_1$) is formed, and the p-type semiconductor substrate 1 are electrically isolated from each other by the n-type well 5. Such a configuration allows prevention of a variation in threshold voltage due to the substrate effect of the n channel type MISFET ($Q_1$).

The description of the n channel type MISFET ($Q_1$) is similar even to each of the individual n channel type MISFETs ($Q_2$, $Q_3$ and $Q_4$). Namely, the n channel type MISFETs ($Q_1$, $Q_2$, $Q_3$ and $Q_4$) shown in FIG. 2 are respectively electrically isolated from the p-type semiconductor substrate by the n-type well 5. Further, the respective p-type wells 6 are also electrically-separated from one another.

Thus, an advantageous effect is brought about in that, since the present embodiment takes a structure in which substrate (p-type well 6) potentials applied to a plurality of MISFETs connected in series can be set independently, desired threshold voltages of each of the individual MISFETs can be outputted.

The above description is applied similarly even to depletion type n channel MISFETs ($DQ_1$, $DQ_2$, $DQ_3$ and $DQ_4$) and hence an advantageous effect similar to the above can be obtained owing to such MISFETs.

The invention made by the present inventors has been described above specifically with reference to various embodiments. However, the present invention is not necessarily limited to the above embodiments. It is needless to say that various changes can be made thereto without departing from the substance thereof.

Figure 22:
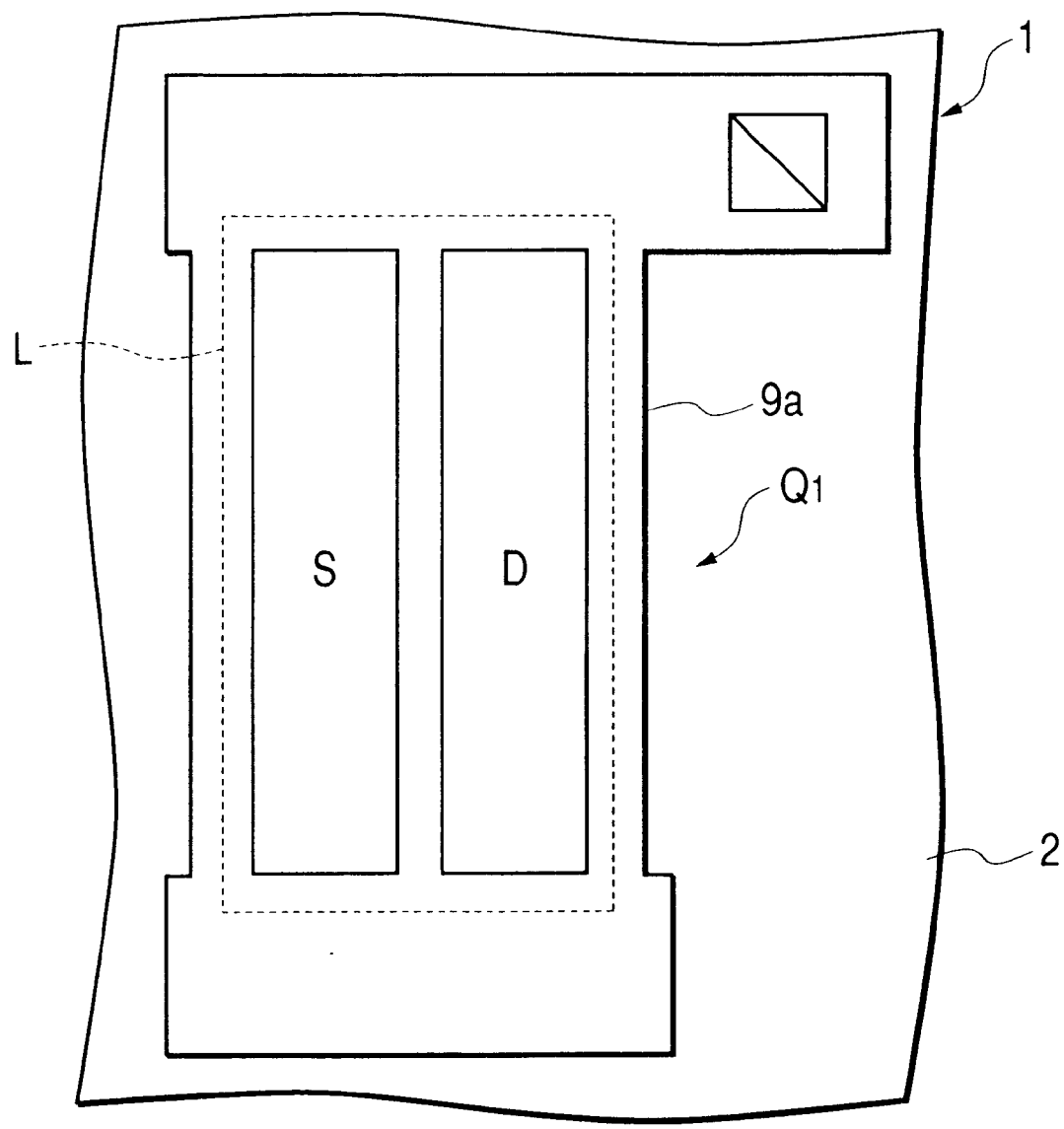
FIG. 22 is a plan view showing a gate electrode pattern of an MISFET which constitutes part of a reference voltage generator employed in another embodiment of the present invention.

The gate electrode of the MISFET, which constitutes the reference voltage generating circuit, may take a flat shape so as to cover the whole or the entirety of a boundary region defined between an active region L and its corresponding element isolation trench 2, as shown in FIG. 22 by way of example, in addition to a flat shape, as shown in FIG. 3(a) and FIG. 3(b).

The gate electrode structure of the present invention can also be applied to a MISFET or the like which constitutes, for example, a standby differential amplifier, as well as to a MISFET which constitutes a reference voltage generating circuit.

While the above embodiments have respectively described the case in which the present invention is applied to a SRAM, the present invention is not limited thereto. The present invention can widely be applied to various LSIs wherein fine MISFETs are formed on a substrate having element isolation trenches.

An advantageous effect obtained by a typical one of the features disclosed by the present application will be explained in brief as follows.

According to the present invention, since a variation in threshold voltage of each scaled-down MISFET can be reduced, a circuit comprised of MISFETs each operated by a small current in particular can be prevented from malfunctioning.

What is claimed is:

1. A semiconductor integrated circuit device comprising:
   a first MISFET formed on a substrate in a first active region whose periphery is defined by an element isolation trench,
   wherein a first gate electrode of said first MISFET is formed on the substrate and extends over the first active region from one end of the first active region to another, opposite end thereof in a direction of gate width, which is the direction of channel width of said first MISFET,
   wherein a gate length of the first gate electrode in a first boundary region defined between the first active region and the element isolation trench is greater than a gate length thereof in a central portion of the first active region, said gate length being in a direction of channel length of said first MISFET, and
   wherein said first gate electrode in the first boundary region covers (i) the entirety of one side of the first boundary region extending in the gate-length direction and (ii) parts of two other sides thereof extending in the gate-width direction.

2. The semiconductor integrated circuit device according to claim 1,
   wherein a source and drain of said first MISFET comprises a lightly doped drain (LDD) structure of a first conductivity-type having a first semiconductor region of a low impurity concentration and a second semiconductor region of a high impurity concentration, and
   wherein said substrate, having the first MISFET formed thereon, includes a pocket region formed thereon comprising a third semiconductor region of a second conductivity-type which surrounds the first semiconductor region.

3. The semiconductor integrated circuit device according to claim 1, wherein said first MISFET is comprised of an enhancement type and constitutes part of a constant voltage generating circuit which generates a voltage lower than a source voltage according to the difference between a threshold voltage of said first MISFET and a threshold voltage of a second MISFET comprised of a depletion type.

4. The semiconductor integrated circuit device according to claim 3, wherein said constant voltage generating circuit is a reference voltage generating circuit which constitutes part of peripheral circuits for a static random access memory (SRAM).

5. A semiconductor integrated circuit device comprising:
   a first MISFET formed on a substrate in a first active region whose periphery is defined by an element isolation trench; and
   a second MISFET formed on the substrate in a second active region whose periphery is defined by an element isolation trench; and
   wherein a first gate electrode of said first MISFET is formed on the substrate and extends over the first active region from one end of the first active region to another, opposite end thereof in a direction of gate width of said first MISFET,
   wherein a second gate electrode of said second MISFET is formed on the substrate and extends over the second active region from one end of the second active region to another, opposite end thereof in a direction of gate width of said second MISFET,
   wherein a gate length of the first gate electrode in a first boundary region defined between the first active region and the element isolation trench thereof is greater than a gate length thereof in a central portion of the first active region,
   wherein a gate length of the second gate electrode in a second boundary region defined between the second active region and the element isolation trench thereof is substantially equal to a gate length thereof in a central portion of the second active region, the gate-width direction and the gate-length direction of each of said first and second MISFETs correspond to the direction of channel width and the direction of channel length thereof, respectively, and
   wherein the first gate electrode in the first boundary region covers the entirety of a side of the first boundary region extending in the gate-length direction of the first MISFET.

6. The semiconductor integrated circuit device according to claim 5, wherein said first gate electrode in the first boundary region covers the entirety of one side of the first boundary region extending in the gate-length direction of said first MISFET, and parts of two other sides thereof extending in the gate-width direction of said first MISFET.

7. The semiconductor integrated circuit device according to claim 5, wherein a threshold voltage of said first MISFET is higher than that of said second MISFET.

8. The semiconductor integrated circuit device according to claim 5, wherein the concentration of a threshold voltage control impurity introduced into the substrate in the first active region is higher than that of a threshold voltage control impurity introduced into the substrate in the second active region.

9. The semiconductor integrated circuit device according to claim 5, wherein said first MISFET is operated at a current lower than that for said second MISFET.

10. A semiconductor integrated circuit device comprising:
    a memory cell comprised of a pair of drive MISFETs, a pair of load MISFETs and a pair of transfer MISFETs, each drive MISFET being formed on a substrate in a corresponding first active region whose periphery is defined by an element isolation trench, and each load MISFET being formed on the substrate in a corresponding second active region whose periphery is defined by an element isolation trench,
    wherein a gate electrode of said each drive MISFET is formed on the substrate and extends over the first active region thereof from one end of that first active region to another, opposite end thereof in a direction of gate width of that drive MISFET,
    wherein a gate length of the gate electrode of said each drive MISFET in a boundary region defined between the first active region and the element isolation trench thereof is greater than a gate length thereof in a central portion of the first active region,
    wherein a gate electrode of each load MISFET is formed on the substrate and extends over the second active region thereof, from one end of that second active region to another, opposite end thereof in a direction of gate width of that load MISFET, and wherein a gate length of the gate electrode of said each load MISFET in said second active region is greater than the gate length of the gate electrode of said each drive MISFET in a central portion of said first active region, the gate-width direction and the gate-length direction of said each drive MISFET and said each load MISFET correspond to the direction of channel width and the direction of channel length thereof, respectively.

11. The semiconductor integrated circuit device according to claim 10, wherein a gate width of the gate electrode of said each drive MISFET is greater than that of said each load MISFET.

12. The semiconductor integrated circuit device according to claim 10, wherein a gate length of the gate electrode of said each drive MISFET in said boundary region thereof is substantially equal to that of the gate electrode of said each load MISFET.

13. A semiconductor integrated circuit device comprising:
a first MISFET formed on a substrate in a first active region whose periphery is defined by an element isolation trench; and
a second MISFET formed on the substrate in a second active region whose periphery is defined by an element isolation trench; and
wherein a first gate electrode of said first MISFET is formed on the substrate and extends over the first active region from one end of the first active region to another, opposing end thereof in a direction of gate width of said first MISFET,
wherein a second gate electrode of said second MISFET is formed on the substrate and extends over the second active region from one end of the second active region to another, opposing end thereof in a direction of gate width of said second MISFET,
wherein a gate length of the first gate electrode in a first boundary region defined between the first active region and the element isolation trench thereof is greater than a gate length thereof in a central portion of the first active region,
wherein a gate length of the second gate electrode in a second boundary region defined between the second active region and the element isolation trench thereof is greater than a gate length thereof in a central portion of the second active region, the gate-width direction and the gate-length direction of each of said first and second MISFETs correspond to the direction of channel width and the direction of channel length thereof, respectively, and
wherein the first gate electrode in the first boundary region covers the entirety of a side of the first boundary region extending in the gate-length direction of said first MISFET.

14. The semiconductor integrated circuit device according to claim 1, further including a second MISFET formed on the substrate in a second active region whose periphery is defined by an element isolation trench, and
wherein a second gate electrode of said second MISFET is formed on the substrate and extends over the second active region from one end of the second active region to another, opposite end thereof in a direction of gate width, which is the direction of channel width of said second MISFET,
wherein a gate length of the second gate electrode in a second boundary region defined between the second active region and the element isolation trench is greater than a gate length thereof in a central portion of the second active region, the gate-length direction being in a direction of channel length of said second MISFET, wherein said second gate electrode in the second boundary region covers (i) the entirety of one side of the second boundary region extending in the gate-length direction and (ii) parts of two other sides thereof extending in the gate-width direction, wherein said first active region is formed in a first well region of a first conductivity type, said second active region is formed in a second well region of a first conductivity type, said first well region is enclosed on all sides with a third well region of a conductivity type opposite to the conductivity type of the first well region, said second well region is enclosed on all sides with a fourth well region of a conductivity type opposite to the conductivity type of the second well region, and said first well region and said second well region are formed to be electrically isolated from each other, and wherein said first MISFET and said second MISFET are connected in series and constitute a voltage generating circuit.

15. A semiconductor integrated circuit device comprising:
a first MISFET formed on a substrate in a first active region whose periphery is defined by an element isolation trench; and
a second MISFET formed on the substrate in a second active region whose periphery is defined by an element isolation trench,
wherein a first gate electrode of said first MISFET is formed on the substrate and extends over the first active region from one end of the first active region to another, opposite end thereof in a direction of gate width of said first MISFET,
wherein a gate length of the first gate electrode in a first boundary region defined between the first active region and the element isolation trench thereof is greater than a gate length in a central portion of the first active region,
wherein said first gate electrode in the first boundary region covers the entirety of one side of the first boundary region extending in the gate-length direction, and parts of two other sides thereof extending in the gate-width direction,
wherein a second gate electrode of said second MISFET is formed on the substrate and extends over the second active region from one end of the second active region to another, opposite end thereof in a direction of gate width of said second MISFET,
wherein a gate length of the second gate electrode in a second boundary region defined between the second active region and the element isolation trench is greater than a gate length in a central portion of the second active region, the gate-width direction and the gate-length direction of each of said first and second MISFETs correspond to the direction of channel width and the direction of channel length thereof, respectively,
wherein said second gate electrode in the second boundary region covers (i) the entirety of one side of the second boundary region extending in the gate-length direction and (ii) parts of two other sides thereof extending in the gate-width direction, and
wherein said first active region is formed in a first well region of a first conductivity type, said second active region is formed in a second well region of the first conductivity type, and said first well region and said second well region are formed to be electrically isolated from each other.

16. The semiconductor integrated circuit device according to claim 15, wherein said first MISFET and said second MISFET are connected in series.

17. The semiconductor integrated circuit device according to claim 16, wherein said first MISFET and said second MISFET constitute a voltage generating circuit.

18. The semiconductor integrated circuit device according to claim 15, wherein said first well region is enclosed on all sides with a third well region of a conductivity type opposite to the conductivity type of the first well region, said second well region is enclosed on all sides with a fourth well region of a conductivity type opposite to the conductivity type of the second well-region, and said first well region and said second well region are formed to be electrically isolated from each other within the substrate which is of the first conductivity type.

19. The semiconductor integrated circuit device according to claim 18, wherein said first MISFET and said second MISFET are respectively enhancement types.

20. The semiconductor integrated circuit device according to claim 18, wherein said first MISFET and said second MISFET are respectively depletion types.

21. The semiconductor integrated circuit device according to claim 18, wherein said first MISFET and said second MISFET are connected in series and constitute a voltage generating circuit.

22. The semiconductor integrated circuit device according to claim 13, wherein said first MISFET is comprised of an enhancement type and constitutes part of a constant voltage generating circuit which generates a voltage lower than a source voltage according to the difference between a threshold voltage of said first MISFET and a threshold voltage of said second MISFET comprised of a depletion type.

23. The semiconductor integrated circuit device according to claim 13, wherein said constant voltage generating circuit is a reference voltage generating circuit which constitutes part of peripheral circuits for a static random access memory (SRAM).

24. The semiconductor integrated circuit device according to claim 1, wherein said first gate electrode, in the first boundary region, covers (i) the entirety of both ones of a pair of opposing sides of the first boundary region extending in the gate-length direction of said first MISFET and (ii) parts of two other sides thereof extending in the gate-width direction of said first MISFET.

25. The semiconductor integrated circuit device according to claim 1, wherein the first gate electrode is extended to cover the entirety of said first boundary region.

26. The semiconductor integrated circuit device according to claim 5, wherein said first MISFET is comprised of an enhancement type and constitutes part of a constant voltage generating circuit which generates a voltage lower than a source voltage according to the difference between a threshold voltage of said first MISFET and a threshold voltage of said second MISFET comprised of a depletion type.

27. The semiconductor integrated circuit device according to claim 5, wherein said first gate electrode, in the first boundary region, covers (i) the entirety of both ones of a pair of opposing sides of the first boundary region extending in the gate-length direction of said first MISFET and (ii) parts of the two other sides thereof extending in the gate-width direction of said first MISFET.

28. The semiconductor integrated circuit device according to claim 10, wherein the gate electrode of said each drive MISFET in said first boundary region thereof is extended to cover a portion of each of opposing end sides of said first active region thereof which are extended in the gate-width direction of that MISFET.

29. The semiconductor integrated circuit device according to claim 15, wherein said first MISFET is comprised of an enhancement type and constitutes part of a constant voltage generating circuit which generates a voltage lower than a source voltage according to the difference between a threshold voltage of said first MISFET and a threshold voltage of said second MISFET comprised of a depletion type.

30. The semiconductor integrated circuit device according to claim 15, wherein the first gate electrode is extended to cover the entirety of said first boundary region.

31. The semiconductor integrated circuit device according to claim 15,
   wherein said first gate electrode, in the first boundary region, covers (i) the entirety of both ones of a pair of opposing sides of the first boundary region extending in the gate-length direction of said first MISFET and (ii) parts of two other sides thereof extending in the gate-width direction of said first MISFET, and
   wherein said second gate electrode, in the second boundary region, covers (i) the entirety of both ones of a pair of opposing sides of the second boundary region extending in the gate-length direction of said second MISFET and (ii) parts of two other sides thereof extending in the gate-width direction of said second MISFET.

32. The semiconductor integrated circuit device according to claim 15,
   wherein the first gate electrode is extended to cover the entirety of said first boundary region, and
   wherein the second gate electrode is extended to cover the entirety of said second boundary region.

* * * * *